US009982859B2

(12) United States Patent
Chen et al.

(10) Patent No.: US 9,982,859 B2
(45) Date of Patent: May 29, 2018

(54) LIGHT EMITTING DIODE, AND HEADLAMP AND SIGNAL LAMP HAVING THE SAME

(71) Applicant: ADVANCED OPTOELECTRONIC TECHNOLOGY, INC., Hsinchu Hsien (TW)

(72) Inventors: Shiue-Lung Chen, Hsinchu (TW); Shr-Min Lin, Hsinchu (TW); Yu-Wei Tsai, Hsinchu (TW); Chung-Min Chang, Hsinchu (TW)

(73) Assignee: ADVANCED OPTOELECTRONIC TECHNOLOGY, INC, Hsinchu Hsien (TW)

( * ) Notice: Subject to any disclaimer, the term of this patent is extended or adjusted under 35 U.S.C. 154(b) by 0 days. days.

(21) Appl. No.: 15/391,805

(22) Filed: Dec. 27, 2016

(65) Prior Publication Data

US 2018/0066819 A1 Mar. 8, 2018

(30) Foreign Application Priority Data

Sep. 8, 2016 (CN) .......................... 2016 1 0809916

(51) Int. Cl.

| | |
|---|---|
| ***F21S 8/10*** | (2006.01) |
| ***H01L 33/48*** | (2010.01) |
| *F21Y 115/10* | (2016.01) |

(52) U.S. Cl.

CPC ......... *F21S 48/1104* (2013.01); *F21S 48/115* (2013.01); *F21S 48/1225* (2013.01); *F21S 48/212* (2013.01); *F21S 48/215* (2013.01); *F21S 48/2212* (2013.01); *F21S 48/328* (2013.01); *H01L 33/486* (2013.01); *F21Y 2115/10* (2016.08)

(58) Field of Classification Search

CPC .. F21S 48/1104; F21S 48/115; F21S 48/1225; F21S 48/212; F21S 48/215; F21S 48/2212; F21S 48/328; H01L 33/486; F21Y 2115/10

USPC .................... 362/545, 544, 543, 547, 249.02

See application file for complete search history.

(56) References Cited

U.S. PATENT DOCUMENTS 6,827,469 B2 * 12/2004 Coushaine .............. F21K 9/232 362/249.06
2010/0124060 A1 * 5/2010 Wang ........................ F21K 9/00 362/249.06
2010/0157595 A1 * 6/2010 Lin ........................... F21K 9/00 362/235

(Continued)

FOREIGN PATENT DOCUMENTS

TW 201441527 A 11/2014
TW M493158 U 1/2015
TW 201541020 A 11/2015

*Primary Examiner* — Laura Tso
(74) *Attorney, Agent, or Firm* — ScienBiziP, P.C.

(57) ABSTRACT

An LED light source includes a connecting body and a mounting base. The mounting base includes a mounting platform having a top surface, and an LED unit connected to the top surface, the top surface having good heat-dissipating properties. The LED unit includes LEDs, an LED driving device, and a circuit board. The circuit board includes a first portion for mounting the driving device and a second portion for mounting the LEDs. The first portion is connected to the top surface. The second portion is bent away from the first portion; the LEDs being mounted to outer surface of the integral second portion.

19 Claims, 6 Drawing Sheets

(56) References Cited

U.S. PATENT DOCUMENTS

| | | | | |
|---|---|---|---|---|
| 2010/0284188 | A1* | 11/2010 | Chen | F21K 9/232 362/249.02 |
| 2011/0075431 | A1* | 3/2011 | Wu | F21V 29/20 362/373 |
| 2012/0281411 | A1* | 11/2012 | Kajiya | H05K 1/028 362/249.02 |
| 2012/0287636 | A1* | 11/2012 | Chen | F21K 9/232 362/249.02 |
| 2013/0271987 | A1* | 10/2013 | Hussell | F21V 3/0472 362/249.02 |
| 2014/0022788 | A1* | 1/2014 | Dan | F21V 3/02 362/249.02 |
| 2014/0119008 | A1* | 5/2014 | Chen | F21K 9/135 362/235 |
| 2017/0167663 | A1* | 6/2017 | Hsiao | F21K 9/232 |
| 2017/0241598 | A1* | 8/2017 | Jiang | F21K 9/237 |

* cited by examiner

LIGHT EMITTING DIODE, AND HEADLAMP AND SIGNAL LAMP HAVING THE SAME

The subject matter relates to illumination devices, and more particularly to a light emitting diode (LED), and a headlamp and a signal lamp having the LED.

BACKGROUND

LEDs are used in various fields such as numeral/character display elements, signal lights, light sources for lighting, and display devices. An LED as a light source may include a holder, a substrate located at one end of the holder, and a plurality of LEDs arranged on a flat plane of the substrate. Since the LEDs generate heat when working, the substrate needs to dissipate the heat generated. However, the size of the LED may limit the size of the substrate, thereby limiting a heat-dissipation efficiency. Therefore, there is room for improvement within the art.

BRIEF DESCRIPTION OF THE DRAWINGS

Implementations of the present technology will now be described, by way of example only, with reference to the attached figures.

DETAILED DESCRIPTION

Figure 1:
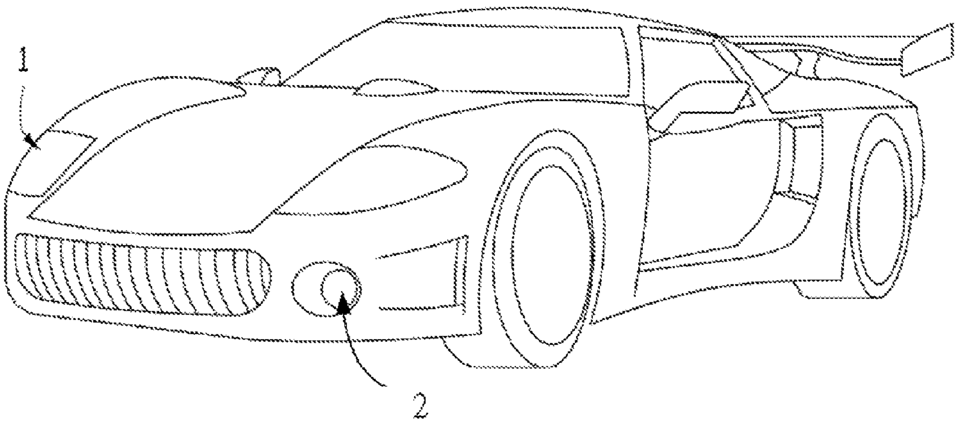
FIG. 1 is a diagrammatic view of an exemplary embodiment of a headlamp and a signal lamp in a vehicle.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 2:
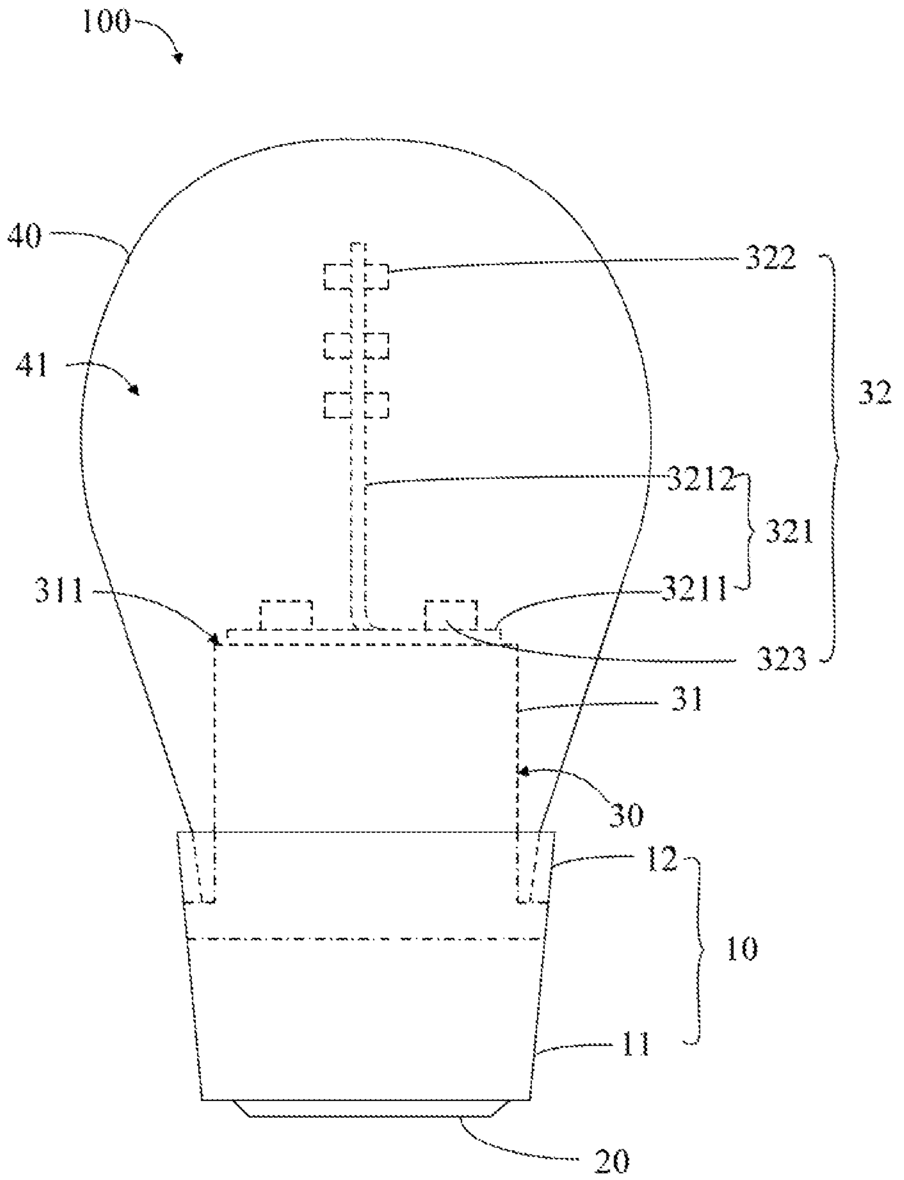
FIG. 2 is a diagrammatic view of an LED comprised in the headlamp or the signal lamp of FIG. 1.

FIGS. 1 and 2 illustrate an exemplary embodiment of a headlamp 1 and a signal lamp 2. The signal lamp 2 is an exterior signal lamp, such as a turning lamp, a reversing lamp, a brake lamp, and so on. In other exemplary embodiments, the signal lamp 2 can also be an interior signal lamp. Each of the headlamp 1 and the signal lamp 2 comprises a light source in the form of a light emitting diode (LED) 100. The LED 100 comprises a connecting body 10 having a first end 11 and a second end 12, the first end 11 being opposite to the second end 12, a lamp cap 20 located at the first end 11 of the connecting body 10, and a mounting base 30 located at the second end 12 of the connecting body 10. In at least one exemplary embodiment, the LED 100 can further comprise a sheath 40 connected to the connecting body 10. The sheath 40 and the connecting body 10 cooperatively define an enclosed space 41 for receiving the mounting base 30.

The connecting body 10 can be made of a material selected from a group consisting of copper, copper alloy, aluminum, aluminum alloy, and aluminum nitride ceramic.

The lamp cap 20 is electrically connected to a power source (not shown). In at least one exemplary embodiment, screw threads (not shown) are formed on an outer circumference of the lamp cap 20 for securing the LED 100 in a socket.

The mounting base 30 comprises a mounting platform 31 having a top surface 311 facing away from the connecting body 10, and an LED unit 32 connected to the top surface 311. In at least one exemplary embodiment, the LED unit 32 can be connected to the top surface 311 by surface mounted technology (SMT), chip scale package (CSP), or chip-on-board (COB). In at least one exemplary embodiment, the mounting platform 31 is made of material with high heat conductivity, such as aluminum, ceramic, copper, nano-carbon, and diamond-like material, thereby facilitating the dissipation of heat from the mounting platform 31.

The LED unit 32 comprises a circuit board 321, a number of LEDs 322, and at least one driving device 323 electrically connected to the LEDs 322. The LEDs 322 and the driving device 323 are mounted on the circuit board 321. The circuit board 321 can be a flexible circuit board. The circuit board 321 comprises a first portion 3211 for mounting the driving device 323, and a second portion 3212 for mounting the LEDs 322. The first portion 3211 is substantially flat and connects to the top surface 311. The second portion 3212 is bent out from the first portion 3211 and extends away from the first portion 3211 in a direction away from the first portion 3211. The LEDs 322 are mounted to each outer surface of the second portion 3212 to emit light in all directions. Thus, the LED 100 has omnidirectional light distribution. The driving device 323 is electrically connected to the lamp cap 20 and further electrically connected to the LEDs 322 through the first portion 311. Therefore, the driving device 323 electrically connects the power source to the LEDs 322 through the lamp cap 20, thereby supplying electrical power to the LEDs 322.

In the above exemplary configuration, the circuit board 321 comprises the first portion 3211 and the second portion 3212. The second portion 3212 bends out from and extends away from the first portion 3211. Thus, in the above configuration, the heat generated by the LEDs 322 is separated from the heat generated by the driving device 323. As such, the heat generated by the driving device 323 can be rapidly dissipated to the mounting base 30, so that the LEDs 322 can be more easily to be dissipated and thus obtain an improved light efficiency. Furthermore, wiring layouts for the LEDs 322 and the driving device 323 can be placed on the circuit board 321 simultaneously which improves manufacturing efficiency for the LED unit 32.

In at least one exemplary embodiment, the circuit board 321 is a metal core printed circuit board (MCPCB) that allows accelerated heat dissipation of heat generated by the LEDs 322 to the mounting platform 31. For example, the circuit board 321 may be an aluminum core printed circuit board or a copper core printed circuit board.

Figure 3:
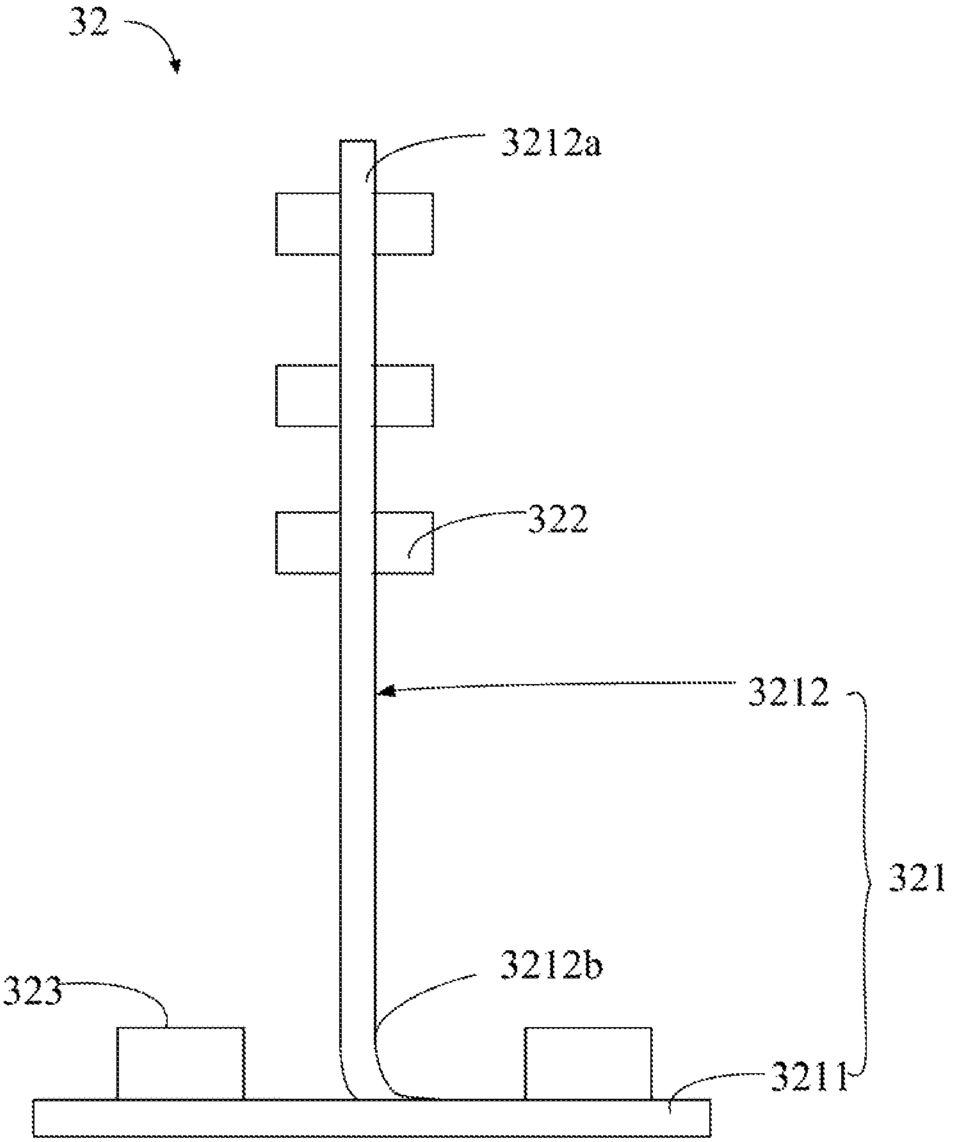
FIG. 3 is a diagrammatic view of an LED unit of the LED of FIG. 2.

Referring to FIG. 3, in this exemplary embodiment, a cross-section of the circuit board 321 is substantially flipped T-shaped. The second portion 3212 comprises a first edge 3212*a* and a second edge 3212*b*, the first edge 3212*a* being opposite to the second edge 3212*b*. The second edge 3212*b* of the second portion 3212 bends from the first portion 3211 to connect to a surface of the first portion 3211 near a center of the first portion 3211. Thus, the second edge 3212*b* of the second portion 3212 bends to align with a direction substantially parallel to the first portion 3211. The remaining portions of the second portion 3212, including the first edge 3212*a* of the second portion 3212, extend out along a direction substantially perpendicular to the first portion 3211. The LEDs 322 are mounted to opposite surfaces of the second portion 3212. An angle between the second portion 3212 and the first portion 3211 may be different, thereby changing the directions of light emitted from the LEDs 322.

Figure 4:
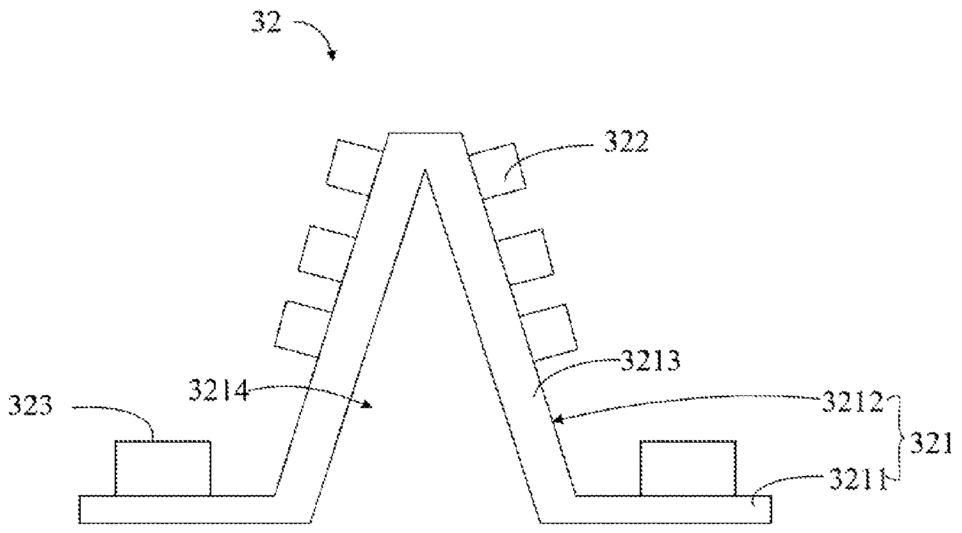
FIG. 4 is a diagrammatic view of an LED unit according to another exemplary embodiment.

FIG. 4 illustrates that in another exemplary embodiment, a cross-section of the second portion 3212 is substantially triangular. The second portion 3212 comprises two sidewalls 3213 that are bent from a center portion of the first portion 3211 and extending away from the first portion 3211. The two sidewalls 3213 are angled towards each other and connect to each other at their respective top ends to form an angle. The LEDs 322 are mounted to an outer surface of each sidewall 3213. The two sidewalls 3213 and the first portion 3211 cooperatively define a receiving space 3214 for receiving heat-dissipating material. The heat generated by the LEDs 322 can successively pass through the second portion 3212 and the heat-dissipating material to the mounting platform 31. The heat-dissipating material can be nano-carbon or diamond-like carbon. An angle between each sidewall 3213 and the first portion 3211 may be different, thereby changing the directions of light emitted from the LEDs 322.

Figure 5:
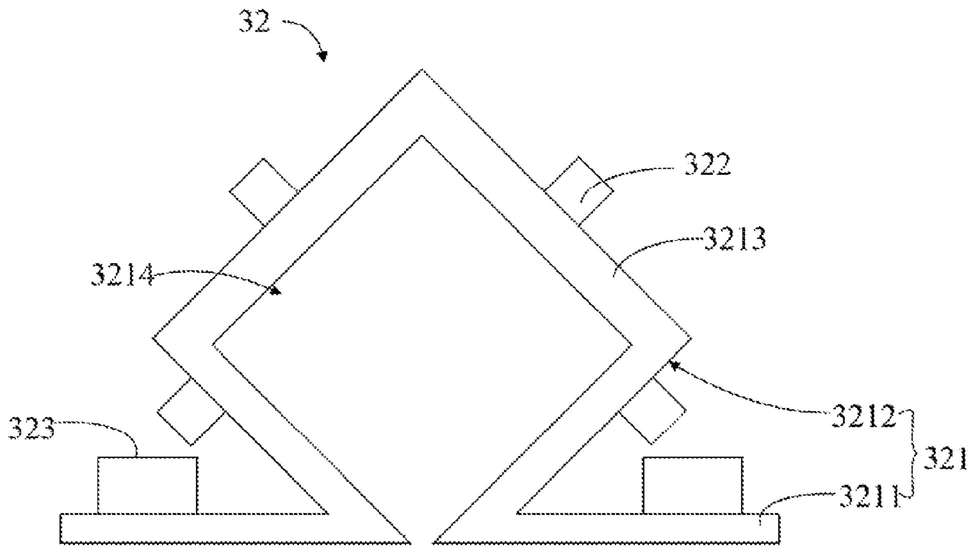
FIG. 5 is a diagrammatic view of an LED unit according to another exemplary embodiment.

FIG. 5 illustrates that in yet another exemplary embodiment, a cross-section of the second portion 3212 is substantially polygonal. The second portion 3212 comprises a number of sidewalls 3213 that are bent from a center portion of the first portion 3211 and extending away from the first portion 3211. The sidewalls 3213 are connected to each other end-to-end, and each two adjacent sidewalls 3213 are angled to each other. In one embodiment the angle between two adjacent sidewalls 3213 is acute. In another embodiment the angle between two adjacent sidewalls 3213 is an obtuse or right angle. The LEDs 322 are mounted to an outer surface of each sidewall 3213. The sidewalls 3213 and the first portion 3211 cooperatively define a receiving space 3214 for receiving the heat-dissipating material.

Figure 6:
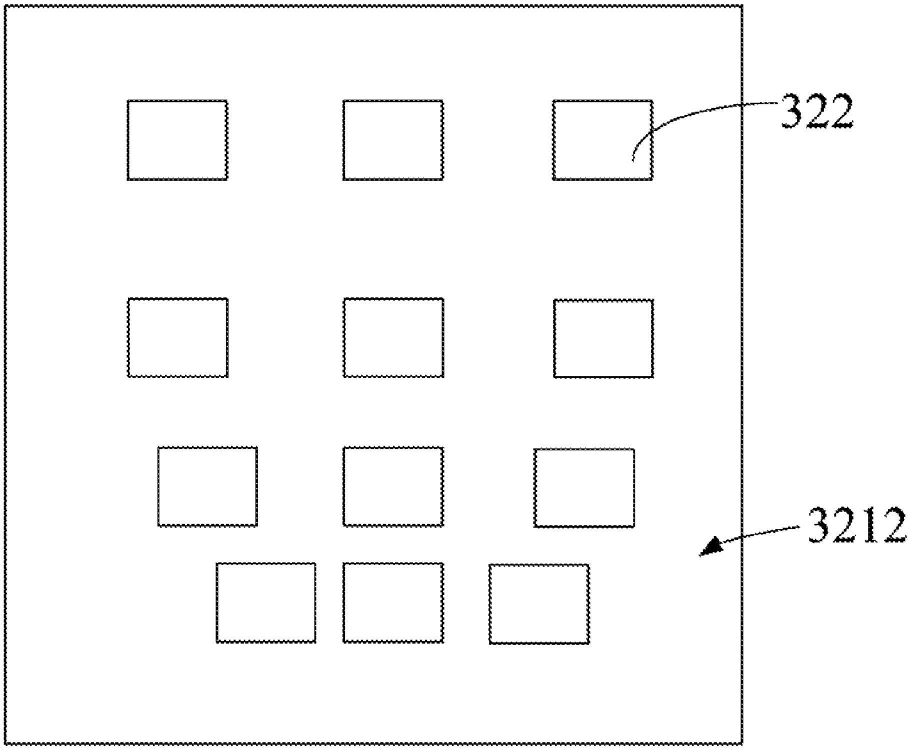
FIG. 6 is similar to FIG. 3, but showing LEDs of the LED unit in a different pattern.

The LEDs 322 can be arranged on each outer surface of the second portion 3212 in different patterns, thereby changing the characteristics of light emitted from the LEDs 322. In at least one exemplary embodiment, the LEDs 322 are arranged on each outer surface of the second portion 3212 in a regular matrix. The LEDs 322 are spaced from each other, thereby accelerating the dissipation of the heat generated by the LEDs 322. In another exemplary embodiment, referring to FIG. 6, the densities of the LEDs 322 arranged on different locations of each outer surface of the second portion 3212 can vary and gradually change. For example, a density of the LEDs 322 arranged on a top end of each outer surface of the second portion 3212 facing away from the first portion 3211 is less than a density of the LEDs 322 arranged on a bottom end of the outer surface opposite to the top end.

In another exemplary embodiment, the mounting platform 31 extends from the connecting body 10, that is, the connecting body 10 and the mounting platform 31 are integrally formed together.

In at least one exemplary embodiment, the sheath 40 is latched to the connecting body 10. The sheath 40 is made of transparent or translucent material such as polycarbonate (PC), for transmission of the light emitted from the LEDs 322.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments, to the full extent indicated by the plain meaning of the terms in which the appended claims are expressed.

What is claimed is:

1. A light emitting diode (LED) comprising:

a connecting body having a first end and a second end, the first end being opposite to the second end; and a mounting base located at the second end of the connecting body, the mounting base comprising a mounting platform having a top surface, the top surface facing away from the connecting body, the mounting base further comprising an LED unit connected to the top surface, the LED unit comprising:

a plurality of LEDs;

at least one driving device electrically connected to the plurality of LEDs; and a circuit board comprising a first portion and a second portion, each driving device mounted on the first portion, the first portion being substantially flat and connected to the top surface, the second portion being bent out from the first portion and extending away from the first portion and the connecting body, the plurality of LEDs mounted to each outer surface of the second portion.

2. The LED of claim 1, wherein a cross-section of the circuit board is substantially flipped T-shaped, and wherein the second portion comprises a first edge and a second edge, the first edge being opposite to the second edge, wherein the second portion bends to connect to a surface of the first portion near a center of the first portion, and wherein the second edge of the second portion bends to align with a direction substantially parallel to the first portion, and wherein the second portion extends out along a direction substantially perpendicular to the first portion, the plurality of LEDs is mounted to two opposite surfaces of the second portion.

3. The LED of claim 1, wherein a cross-section of the second portion is substantially triangular, the second portion comprises two sidewalls that are bent from a center portion of the first portion and extending away from the first portion, the two sidewalls are angled to each other and connected to each other at their respective top ends to form an angle, the plurality of LEDs are mounted to an outer surface of each sidewall, the two sidewalls and the first portion cooperatively define a receiving space for receiving heat-dissipating material.

4. The LED of claim 3, wherein the heat-dissipating material is one of nano-carbon and diamond-like carbon.

5. The LED of claim 1, wherein a cross-section of the second portion is substantially polygonal, the second portion comprises a plurality of sidewalls that are bent from a center portion of the first portion and extending away from the first portion, the plurality of sidewalls are connected to each other end-to-end, each two adjacent sidewalls are angled to each other, wherein the plurality of LEDs are mounted to an outer surface of each sidewall, the plurality of sidewalls and the first portion cooperatively define a receiving space for receiving heat-dissipating material.

6. The LED of claim 5, wherein the heat-dissipation material is one of nano-carbon and diamond-like carbon.

7. The LED of claim 1, wherein the plurality of LEDs is arranged on each outer surface of the second portion in a regular matrix, the plurality of LEDs is spaced apart from each other.

8. The LED of claim 1, wherein densities of the plurality of LEDs arranged on different locations of each outer surface of the second portion are gradually changed.

9. The LED of claim 8, wherein a density of the plurality of LEDs arranged on a top end of each outer surface of the second portion facing away from the first portion is less than a density of the plurality of LEDs arranged on a bottom end of the outer surface opposite to the top end.

10. The LED of claim 1, wherein the connecting body and the mounting platform are integrally formed together.

11. The LED of claim 1, further comprising a lamp cap and a sheath, wherein the lamp cap is located at the first end of the connecting body opposite to the mounting base, the sheath is connected to the connecting body, the sheath and the connecting body cooperatively define an enclosed space for receiving the mounting base, the driving device is electrically connected to the lamp cap and further electrically connected to the plurality of LEDs through the first portion.

12. The LED of claim 1, wherein the LED unit is connected to the top surface by at least one of surface mounted technology, chip scale package, and chip-on-board.

13. The LED of claim 1, wherein the mounting platform is made of a material with high heat conductivity.

14. The LED of claim 1, wherein the circuit board is a metal core printed circuit board.

15. The LED of claim 14, wherein the circuit board is one of an aluminum core printed circuit board and a copper core printed circuit board.

16. A headlamp comprising:

a light emitting diode (LED) comprising:

a connecting body having a first end and a second end, the first end being opposite to the second end; and a mounting base located at the second end of the connecting body, the mounting base comprising a mounting platform having a top surface facing away from the connecting body, the mounting base further comprising an LED unit connected to the top surface, the LED unit comprising:

a plurality of LEDs;

at least one driving device electrically connected to the plurality of LEDs; and a circuit board comprising a first portion, each driving device mounted on the first portion, the first portion being substantially flat and connected to the top surface, the second portion being bent out from the first portion and extending away from the first portion and the connecting body, the plurality of LEDs mounted to each outer surface of the second portion.

17. A signal lamp comprising:

a light emitting diode (LED) comprising:

a connecting body having a first end and a second end, the first end being opposite to the second end; and a mounting base located at the second end of the connecting body, the mounting base comprising a mounting platform having a top surface facing away from the connecting body, the mounting base further comprising an LED unit connected to the top surface, the LED unit comprising:

a plurality of LEDs;

at least one driving device electrically connected to the plurality of LEDs; and a circuit board comprising a first portion, each driving device mounted on the first portion, the first portion being substantially flat and connected to the top surface, the second portion being bent out from the first portion and extending away from the first portion and the connecting body, the plurality of LEDs mounted to each outer surface of the second portion.

18. The headlamp of claim 16, wherein a cross-section of the circuit board is substantially flipped T-shaped, and wherein the second portion comprises a first edge and a second edge, the first edge being opposite to the second edge, wherein the second portion bends to connect to a surface of the first portion near a center of the first portion, and wherein the second edge of the second portion bends to align with a direction substantially parallel to the first portion, and wherein the second portion extends out along a direction substantially perpendicular to the first portion, the plurality of LEDs is mounted to two opposite surfaces of the second portion.

19. The signal lamp of claim 17, wherein a cross-section of the circuit board is substantially flipped T-shaped, and wherein the second portion comprises a first edge and a second edge, the first edge being opposite to the second edge, wherein the second portion bends to connect to a surface of the first portion near a center of the first portion, and wherein the second edge of the second portion bends to align with a direction substantially parallel to the first portion, and wherein the second portion extends out along a direction substantially perpendicular to the first portion, the plurality of LEDs is mounted to two opposite surfaces of the second portion.

* * * * *